(12) United States Patent
Wang

(10) Patent No.: US 8,726,829 B2
(45) Date of Patent: May 20, 2014

(54) CHEMICAL BATH DEPOSITION APPARATUS FOR FABRICATION OF SEMICONDUCTOR FILMS THROUGH ROLL-TO-ROLL PROCESSES

(76) Inventor: Jiaxiong Wang, Danville, CA (US)

( * ) Notice: Subject to any disclaimer, the term of this patent is extended or adjusted under 35 U.S.C. 154(b) by 451 days.

(21) Appl. No.: 13/154,481

(22) Filed: Jun. 7, 2011

(65) Prior Publication Data

US 2011/0256656 A1    Oct. 20, 2011

(51) Int. Cl.
*C23C 16/00* (2006.01)
(52) U.S. Cl.
USPC .............. 118/58; 118/61; 118/65; 118/300; 118/718; 205/155; 205/166; 205/305
(58) Field of Classification Search
CPC .. C23C 18/1208; C23C 14/562; C23C 14/08; C23C 14/3414; C23C 18/08; C23C 4/121; C23C 28/04; B05C 11/00
USPC ......... 118/58, 61, 64–65, 300, 323–324, 718, 118/720, 305, 316; 205/155, 158–159, 169, 205/305, 316
See application file for complete search history.

(56) References Cited

U.S. PATENT DOCUMENTS

2011/0011340 A1*  1/2011  Basol ........................... 118/719

* cited by examiner

*Primary Examiner* — H Tsai

(57) ABSTRACT

A chemical bath deposition apparatus is presented to prepare different thin films on continuous flexible substrates in roll-to-roll processes. In particular, they are useful to deposit CdS or ZnS buffer layers in manufacture of thin film solar cells. This apparatus deposits thin films onto vertically travelling continuous flexible workpieces delivered by a roll-to-roll system. The thin films are deposited with continuously spraying the reaction solutions from their freshly mixed styles to gradually aged forms until the designed thickness is obtained. The substrates and the solutions are heated to a reaction temperature. During the deposition processes, the front surfaces of the flexible substrates are totally covered with the sprayed solutions but the substrate backsides are remained dry. The reaction ambience inside the reactor can be isolated from the outside atmosphere. The apparatus is designed to generate a minimum amount of waste solutions for chemical treatments.

11 Claims, 4 Drawing Sheets

CHEMICAL BATH DEPOSITION APPARATUS FOR FABRICATION OF SEMICONDUCTOR FILMS THROUGH ROLL-TO-ROLL PROCESSES

FIELD OF THE INVENTION

The present invention relates to a chemical bath deposition (CBD) apparatus that can be used to deposit semiconductor thin films onto flexible substrates continuously delivered through a roll-to-roll or reel-to-reel process. It is particularly useful for deposition of cadmium sulfide (CdS) or zinc sulfide (ZnS) semiconductor films for fabrication of thin film solar cells.

BACKGROUND

Photovoltaic technology has been developed under a background of global warming and exhausting of fossil fuels. The substitutes of traditional energy sources include nuclear energy and renewable energy. Among them, the nuclear energy will also be exhausted in the future. Moreover, the potential radiation contamination arising from the nuclear energy may bring serious problems to our environment, especially after the recent accident in a nuclear power station of Japan. Therefore, our future may greatly rely on renewable energy. The photovoltaic devices, or solar cells, are playing a leading role in the renewable energy. This enormous future demand has dramatically pushed the development of photovoltaic technology. At present, the second generation photovoltaic devices, thin film solar cells, have appeared in the global market. They currently include three main types: amorphous silicon, CIGS and CdTe. In this thin film solar cell family, an amorphous silicon cell has a low conversion efficiency that may reach up to 13% for a triple junction design. Besides, it has a problem of power degradation with initial illumination, but its technology is relatively mature. By contrast, a CIGS solar cell possesses the highest conversion efficiency that is as high as 20%, higher than 17% efficiency of the CdTe ones. In the periodic table of the elements, the elements of a CIGS absorber are located in Group IB-IIIA-VIA and the ones of a CdTe absorber in Group IIB-VIA. These absorber materials all belong to multi-component p-type semiconductors. For such a semiconductor material, the distribution of different components and stoichiometry may determine the quality of the material.

Both of CIGS and CdTe solar cells contain a stack of absorber/buffer thin film layers to create an efficient photovoltaic heterojunction. A metal oxide window containing a highly resistive layer, which has a band gap to transmit the sunlight to the absorber/buffer interface, and a lowly resistive layer to minimize the resistive losses and provide electric contacts, is deposited onto the absorber/buffer surface. This kind of design significantly reduces the charge carrier recombination in the window layer and/or in the window/buffer interface because most of the charge carrier generation and separation are localized within the absorber layer. In general, CIGS solar cell is a typical case in Group IB-IIIA-VIA compound semiconductors comprising some of the Group IB (Cu, Ag, Au), Group IIIA (B, Al, Ga, In, Tl) and Group VIA (O, S, Se, Te, Po) elements of the periodic table. These elements are excellent absorber materials for thin film solar cells. In particular, compounds containing Cu, In, Ga, Se and S are generally referred to as CIGS(S), or $Cu(In,Ga)(S,Se)_2$ or $CuIn_{1-x}Ga_x(S_ySe_{1-y})_n$, where $0 \leq x \leq 1$, $0 \leq y \leq 1$ and n is approximately 2, and have already been applied in the solar cell structures that gave rise to conversion efficiencies approaching 20%. Here, $Cu(In,Ga)(S,Se)_2$ means the whole family of compounds with Ga/(Ga+In) molar ratio varying from 0 to 1, and Se/(Se+S) molar ratio varying from 0 to 1. It should be noted that the molar ratios of Ga/(Ga+In) and Cu/(Ga+In) are very important factors to determine the compositions and the conversion efficiencies of the CIGS solar cells. In general, a good CIGS solar cell requires a ratio of Cu/(Ga+In) between 0.75 and 0.95, and Ga/(Ga+In) between 0.3 and 0.6. In comparison with CIGS, the composition of a CdTe solar cell is much simple. In general, the content of Cd is close to 50% in the CdTe films. However, the Cd content may change after the deposition of a CdS layer and the subsequent annealing procedure. Close to the interface of the p-n-junction, for example, a $CdS_xTe_{1-x}$ layer is formed with x usually not exceeding 0.06. However, x has a range changing from 0 to 1, which results in a compound from CdTe (x=0) to CdS (x=1).

Both CIGS and CdTe films have to be annealed to form a uniform stoichiometric compound. A CIGS film is usually annealed at a temperature between 350 and 600° C. in a typical two-stage fabrication procedure. For a CdTe solar cell, a CdS film may firstly be annealed in a superstrate configuration and a CdS/CdTe bilayer may be annealed in a substrate configuration. After annealing, an n-type semiconductor buffer layer such as CdS, ZnS, or $In_2S_3$ should be deposited onto a CIGS semiconductor absorber. After then, transparent conductive oxide (TCO) materials, i.e., ZnO, $SnO_2$, and ITO (indium-tin-oxide), should be deposited to form the solar cells. For a CdTe solar cell, CdS may be deposited onto the surface of CdTe or TCO, depending on its substrate or superstrate configuration. However, a superstrate configuration may not be applicable on a flexible workpiece on the basis of current technology. Therefore, CdS should be deposited onto a CdTe surface to fabricate a CdTe thin film solar cell on a flexible substrate. The CdS thickness requirement is similar to a CIGS and a CdTe cell. They usually require a thin layer of CdS with about 100 nm or thinner.

There are some different technologies to deposit CdS, such as vacuum sputtering and evaporation, spray pyrolysis and chemical bath deposition. Among them, the chemical bath deposition (CBD) seems to produce the best result. In comparison with the vacuum methods, the CBD process is simple and requires cheap equipments. The disadvantage is that it produces lots of cadmium wastes and the post-treatment may be a heavy work.

A common CdS chemical deposition bath contains a cadmium salt and a thiourea solution in ammonia medium. The ammonia medium in the solution plays two roles. On one hand, it provides $OH^-$ ions to hydrolyze thiourea, which slowly releases $S^{2-}$ into the solution. On the other hand, it controls the amount of $Cd^{2+}$ cations in the bath through the generation of its tetra-ammonium complexes that decompose to slowly release $Cd^{2+}$ into the solution. The slowly created $Cd^{2+}$ and $S^{2-}$ ions synthesize the CdS, some of which deposits onto the substrate surfaces. The reaction mechanism may be shown below:

a. $[Cd(NH_3)_4]^{2+} = Cd^{2+} + 4NH_3$     (1)

the instability constant of $[Cd(NH_3)_4]^{2+}$: $K_i = 7.56 \times 10^{-8}$.

b. $(NH_2)_2CS + 2OH^- \rightarrow CH_2N_2 + 2H_2O + S^{2-}$     (2)

c. $Cd^{2+} + S^{2-} \rightarrow CdS$     (3)

The stability product of CdS is: $K_{sp} = 1.4 \times 10^{-29}$ in a strong alkaline solution.

There is a possible side reaction below:

$$Cd^{2+} + 2OH^- \rightarrow Cd(OH)_2 \qquad (4)$$

The solubility product constant of $Cd(OH)_2$ is: $K_{sp}=7.2\times 10^{-15}$. However, $Cd(OH)_2$ will dissolve in the ammonia alkaline solution to become $[Cd(NH_3)_4]^{2+}$ complex cations and not affect the quality of the CdS product.

The CdS precipitation can take place either in the bulk solution to form colloids or at the immersed substrate surface to generate a layer of thin film. According to a main theory, the layer deposition may take three stages: 1) Induction with the ion adsorption and formation of nucleation centers; 2) layer growth with an "ion by ion" mechanism; and 3) layer growth with a "cluster by cluster" mechanism.

The key technology is that the solution must be freshly prepared to make the initial nucleation of CdS to take place directly on the surface of a substrate. Otherwise, the CdS deposition on the substrate surface may be powdery because the initial induction mainly takes place in the bulk solution and the deposition on the substrate may be directly from the "ion-by-ion" or even "cluster-by-cluster" stages. As reported in a U.S. Pat. No. 7,846,489 B2, which is incorporated herein by reference, the formation of CdS in a reaction solution follows two directions, i.e., a homogeneous particle formation in the solution and a heterogeneous film growth on a substrate surface. No matter which kind of mechanism is involved in the CdS formation in an alkaline solution, i.e., ion-by-ion, hydroxide cluster, or complex-decomposition mechanism, as discussed in literatures, a uniform growth of a CdS thin film on a substrate requires interaction between the substrate surface and un-reacted species firstly. A freshly prepared solution can meet this requirement very well. The reaction starting from a freshly prepared solution is not difficult to achieve in a laboratory work. The sample can be simply immersed into a freshly mixed solution at a certain reaction temperature. In fact, there are lots of literature reports relating to the CdS chemical bath deposition in laboratory works, including some patents such as U.S. Pat. No. 6,537,845 B1 describing a CdS chemical surface deposition onto glass substrates coated with CIGS films. However, it is difficult in an industrial manufacture process, especially for a continuously traveling flexible substrate in a roll-to-roll or reel-to-reel process. How to freshly mix a reaction solution on a moving flexible substrate and remain this mixed solution on the substrate surface to react for a period of time at a constant enhanced temperature is a great challenge for a manufacture design.

Although there are plenty of patents and publications related to CdS deposition via CBD methods, the apparatus or equipments for industrially manufacturing CdS or ZnS buffer layers in solar cells with a CBD process are seldom reported. Recently, some CBD apparatus and methods were described in U.S. Pat. No. 7,541,067 B2, U.S. Pat. Appl. Pub. Nos. 2011/0039366 A1, 2009/0255461 A1 and 2009/0246908 A1, which are incorporated herein by references. In these patent and applications, the CdS deposition apparatus were designed for roll-to-roll manufacture processes in fabrications of thin film CIGS solar cells. In these apparatuses, the freshly mixed solutions were delivered onto the surfaces of travelling flexible substrates and remained there during the periods of deposition reactions to grow up the CdS thin films.

The apparatuses presented in the patents described above require some special designs to remain the solutions on the surfaces of the moving flexible substrates in a roll-to-roll process. For example, the substrates might need to be bent using some magnetic or mechanical forces to hold the solutions on the tops. These applied forces may affect smooth movement of the flexible substrates. It might be difficult to remain the surfaces flat, especially for a wide web. It might always be a great challenge to remain backside of the substrates drying. Moreover, lot of time may be required to set up a substrate roll to an appropriate position. The present invention may solve these problems. The apparatus and the related method presented here do not have to bend the flexible substrates and fit to different widths. The equipment is very simple, inexpensive but effective. In addition, a substrate roll setup is every easy and a waste amount is much less.

SUMMARY OF THE INVENTION

The present invention provides a roll-to-roll or reel-to-reel chemical bath deposition apparatus to fabricate semiconductor thin films in preparation of solar cells. It possesses a unique design to vertically deliver a flexible foil through the whole apparatus. The deposition solution is continuously sprayed onto the substrate surface through a whole process from a freshly mixed to an aged stage. During the whole process, the backside of a substrate remains dry. The structure of this equipment is very simple and inexpensive. In addition, the preparation of semiconductor thin films with this apparatus is economical. It also saves volumes of the waste solution to greatly reduce expenses of the waste treatment.

The present invention can be used for preparing thin film materials onto the surfaces of flexible substrates via a CBD method. It is particularly useful to fabricate CdS or ZnS films in preparation of Group IB-IIIA-VIA and Group IIB-VIA thin film solar cells. In comparison with previous inventions, the presently invented apparatus and method should provide a more convenient and economical way in preparation of thin films through a CBD process.

DETAILED DESCRIPTION OF THE INVENTION

The present invention provides an apparatus for CBD deposition of CdS or ZnS thin films to fabricate Group IB-IIIA-VIA or Group IIB-VIA thin film solar cells in a roll-to-roll process. Different from other previous inventions, the present invention delivers the continuous flexible substrates in a vertical position. These flexible substrates may be metallic or non-metallic. The metallic flexible substrates may include but not restricted to foils of stainless steel, aluminum, copper, nickel and molybdenum. The non-metallic substrates ma include films of polymers, plastics and flexible ceramics. The thickness of these flexible substrates may range from 0.02 to 0.5 millimeters depending on different materials. Their widths ma be between 0.1 and 2 meters. The whole CBD deposition process is performed with the present apparatus, or a CBD reactor. This process starts from cleaning the substrate, spraying a freshly mixed solution to the substrate surface, continuously spraying gradually aged solution to the substrate, washing away the reaction solution from the substrate surface while a desired thickness of the film is obtained, rinsing the freshly deposited thin film, and eventually to drying the film at the end. The length of this apparatus depends on the required thickness of thin films. The whole CBD reactor can be assembled with some modular segments. There are several more advantages for this CBD reactor. Firstly, the apparatus is simply designed to result in an inexpensive fabrication. One does not have to worry how to hold a reaction solution on the substrate surface with the development of a thin film, which requires a complicated mechanical design and significantly increases the cost to fabricate the reactor, especially for a wide substrate. Secondly, the present invention can remain backside of the substrate dry and clean, which may greatly reduce amount of the waste solutions for chemical treatments and make the deposition easier. Thirdly, the present invention separates the waste compartment from the rinsing sections. This also significantly reduces the waste amount and amount of the rinsing water because it can be reused in the waste compartment.

Figure 1:
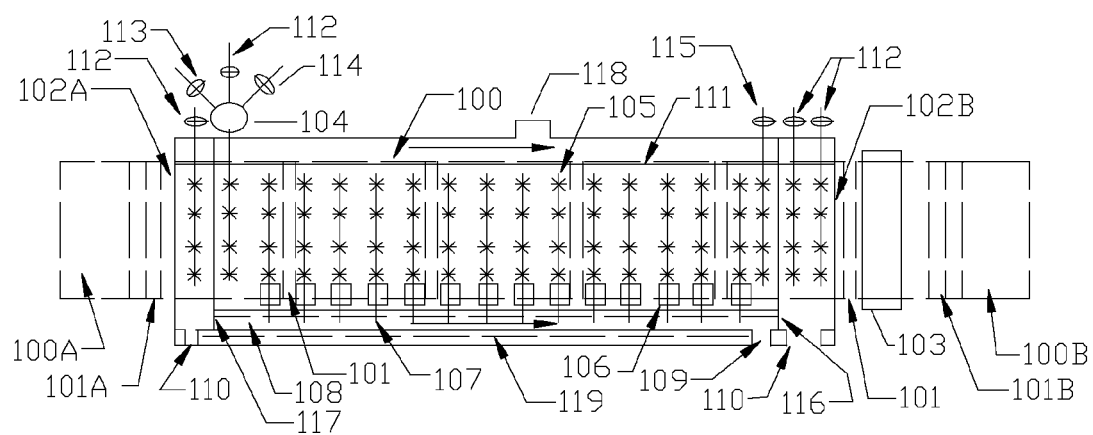
FIG. 1 shows a back view of an apparatus for a CBD deposition onto a continuous flexible workpiece through a roll-to-roll process.

In an embodiment as shown in FIG. 1, a back view diagram for a presently invented apparatus, a roll of flexible substrate 100 is loaded into an unwinding unit 100A, vertically delivered through the entire reactor and ended as a product roll in a winding unit 100B. 101A and 101B are guide rollers controlling the substrate movement. In particular, 101B should be combined with alignment and tension control capability, but the details are not drawn here. Between the rollers 101A and 101B, there are a series of idle rollers 101 inside the reactor chamber to hold the substrate vertically flat at correct positions. As shown in FIG. 1, the substrate and the rollers are drawn in dashed lines and the substrate surface to be deposited is facing back. The substrate is delivered from left to right along the arrow direction.

In another aspect of the embodiment, the length of this CBD reactor is adjustable by adding or reducing numbers of modular segments. Every modular segment has a structure with surrounding a front wall that faces the substrate surface to be deposited, a back wall facing the substrate backside, a top roof and a bottom floor. At least two or more modular segments are connected together to form an isolated chamber of the said CBD reactor. The beginning and the ending segments contain a sidewall where a narrow slit is vertically cut to allow the substrate to enter or leave the chamber. The chamber can be separated with the board 117 and 116 into three sections, i.e., a pre-cleaning section close to the unwinding unit, the reaction chamber (main section), and a rinsing section close to the winding unit at the end, as shown more clearly in FIG. 2. Materials used to fabricate the modular segments must be chemical resistant, such as plastics, polymers, and ceramics. They are also required to resist heat up to 90° C. Especially for the bottom piece, some heating elements have to be installed underneath the solution groove 108. It should be able to resist a higher temperature. If the front and/or the back walls are made from non-transparent materials, some inorganic or organic glass windows shall be opened for an inspection purpose. The internal surfaces of these inspection windows should be treated as hydrophobicity to avoid water condensing. Heights of the front wall, back wall and sidewalls may be between 0.3 and 2.5 meters, depending on the width of a substrate roll. The width of the reaction chamber ranges from 0.3 to 1.5 meters. The reactor is adapted to be used in a roll-to-roll process over a continuous flexible substrate to carry out reactions at an elevated temperature inside the isolated reaction chamber.

In a various aspect of the embodiment, the said reaction chamber contains one or more sets of pump and spray pipe combinations. Every such a combination contains one solution pump 106, one or more spray pipes 107, and at least one or more spray nozzles 105 opened on the pipes. The spray pipes possess closed ends on the tops with diameters from 10 to 80 millimeters. Materials of the pipes and nozzles must be chemical resistant such as plastics, polymers and ceramics. They can also resist heat up to 90° C. Solution chambers of the pumps shall be chemical resistant as well. The metal bodies of the pumps should be protected from the corrosive atmosphere. On the bottom floor, there is a groove 108 crossover the reaction chamber to collect gradually aged solution that flows synchronously along the same direction as the substrate moves. The pumps continuously pump the gradually aged solution out of the groove and spray it onto the substrate surface. The sprayed solution will flow downward to the floor into the groove. There are one or more pieces of heating elements 119 underneath the groove 108 to heat the solution up to an elevated temperature.

Figure 2:
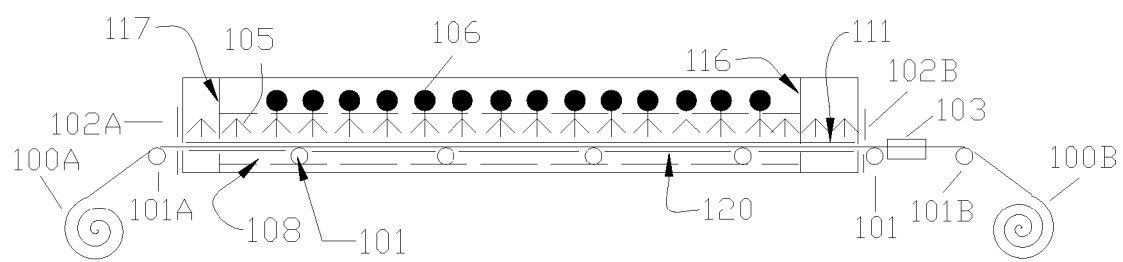
FIG. 2 shows a top view of an apparatus for a CBD deposition onto a continuous flexible workpiece through a roll-to-roll process.

When the roll enters the reactor, it firstly passes a narrow slit on the left wall into the apparatus. Outside the narrow slit, there are two or more columns of wind knives 102A, arranged along the front surface and the backside of the moving substrate, to gently blow preheated air into the chamber through the slits to prevent the atmosphere inside the chamber from leaking out. Similarly, two or more columns of wind knives 102B are arranged on the other side out of the chamber, as shown in FIG. 2. After the roll enters the chamber, it is firstly washed by preheated DI water introduced through the valve 112A and sprayed out of a column of spray nozzles 105. The DI water will cover the whole surface from the top to the bottom to clean the surface and wet it before CdS deposition. If this DI water cannot cover the substrate surface very well due to insufficient pressure, a booster pump may be used before the water enters the pre-clean chamber. The preheated DI water also helps to heat the substrate to a reaction temperature. This DI water washing section has been separated from the main reaction chamber with a board 117. The used water flows through a solution outlet 110A to exhaust without any special treatment.

Figure 3:
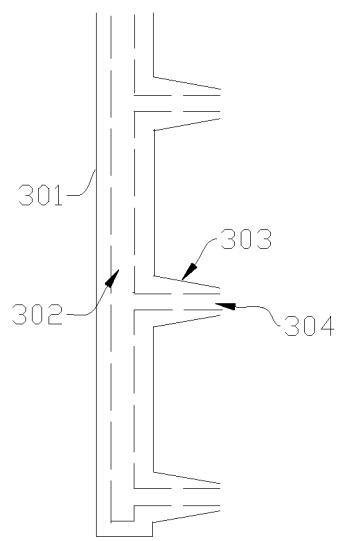
FIG. 3 illustrates a schematic diagram of air-solution spray nozzles.

The substrate then moves into the CBD reaction chamber. As illustrated in FIG. 1, there is a solution mixing vessel 104 on top of the reactor. It can be installed inside the reaction chamber as well. In this mixing vessel, three solution inlets introduce mother liquids into the mixing vessel through the valves 112B, 113 and 114. Valve 112B delivers the preheated DI water, Valve 113 carries one preheated reaction solution such as $Cd^{2+}$ cation ammonia solution, and Valve 114 delivers another preheated solution such as thiourea solution. All of these three solutions are sprayed into the mixing vessel 104. This mixing vessel possesses a oval or pear shape. The sprayed solutions swirl down around the round internal wall and pass a small opening on the bottom of the vessel. During this process, the solutions have been well mixed in just a couple of seconds. The bottom opening of the vessel connected to a pipe 107 with some spray nozzles 105 to spray the mixed solution onto the substrate surface from the top to the bottom. In order to increase the pressure to spray the solution, an air tube can be introduced to the nozzles as demanstrated on FIG. 3. In this device, the solution pipe 302 is incorporated inside an air tube 301. The solution flows from the top to the bottom, runs out of the nozzles 304 and is sprayed by the compressed air nozzles 303. This device carries preheated compressed air to help the solution spray, similar to a spray pyrolysis process. The preheated air helps to remain a constant temperature inside the reaction chamber.

When the freshly mixed solution is sprayed onto the substrate surface, $[Cd(NH_3)_4]^{2+}$ and $(NH_2)_2CS$ will start to adsorb and nucleate on the surface at an induction stage. The used solution flows down into a groove under the substrate and then slowly flows along the same direction as the substrate moves. Then this used solution is pumped up by a pump 106 and sprayed onto the substrate surface again through the pipe 107 and the spray nozzles 105. In this case, the top end of the spray pipe is blocked and the solution is sprayed out with pressure out of the nozzles 105 from the top to the bottom. The reacted solution flows back to the groove 108 again and is pumped up again with a next pump, as illustrated in FIG. 1 and FIG. 2. With the substrate movement to the right direction, its surface is covered with the solutions pumped and sprayed from a series of the pump-spray pipe combinations. The substrate surface is continuously reacted from the freshly mixed solution to gradually aged solution until end of the CBD process. The deposited layer will go through the induction and film growth processes to achieve a high quality thin film. During the whole CBD process, density of the pumps and the spray pipes should be arranged in a way of covering and wetting the full substrate surface. The length of the reaction chamber can be determined by a substrate delivery speed and the designed reaction time. If a substrate delivery speed is 1 meter per minute and the reaction time is 10 minutes, for instance, a 10 meter long reaction chamber is necessary.

In FIG. 1, the dashed line 119 represents a series of heating elements underneath the solution groove 108. As a certain aspect of the embodiment, these heating elements can be fully program-controlled to heat the solution to a constant temperature. In front of the top edge of the substrate, there is a board 111 crossover the whole chamber. It should be designed to block the solution from spraying to the backside. Although this may waste 1-2 cm top edge of the substrate, the edge is usually not useful to fabricate a solar cell. In back of the bottom edge of the substrate, there is a row of wind knives 120 crossover the whole chamber, as illustrated in FIG. 2. It gently blows the preheated air to the back edge of the substrate to avoid the solution wetting onto the back edge. These top and bottom protection may remain the entire backside dry during the whole CBD process.

At the end of the reaction chamber as separated with a board 116, the substrate surface is washed with the used DI water through a valve 115. The DI water here has been used at the next rinsing stage but preheated before it is used in the reaction chamber. Also, the preheated compressed air may be used here to help spraying if necessary. The aged solution and this washing solution are combined here and flow out of the waste outlet 109 on the equipment bottom floor. This waste solution contains cadmium, sulfur, ammonium and other chemicals. It needs to be seriously treated.

When the substrate goes through the slit on a separation board 116 into the rinsing chamber, perhaps 99% of the residue of the reaction solution has been washed away in the previous washing stage. In this section, the substrate surface is further rinsed twice with clean DI water delivered through the valves 112 to make the deposited film totally clean. The rinsed water is collected through the water outlet 110B on the equipment bottom floor, and a part of it is reused to wash the substrate in the previous reaction chamber. The cleaned substrate is now travelling out of the chamber isolated from outside atmosphere. When it goes through the slit in the end wall, it is pre-dried by the wind knives 102B and further dried through a heating device 103 before it is winded as a product roll 100B in the winding unit 100B.

Within the reaction chambre, the atmosphere is controlled at a constant temperature with the heating elements on the bottom and the preheated air, DI water and the solutions. The waste gas containing ammonium is exhaused through the top outlet 118 to an evacuation system. The whole process is further demonstrated in FIG. 2 as a top view. Here the workpiece roll and the rollers are more clearly illustrated. The wind knives 102A and 102B are clearly shown. 120 is the row of wind knives in back of the bottom edge of a substrate to prevent the solution from wetting to the back edge of the substrate, as described above. The width of the aged solution groove 108 is illustrated as well.

EXAMPLE

A CdS Film Deposition for Fabrication of a CIGS Solar Cell

Figure 4:
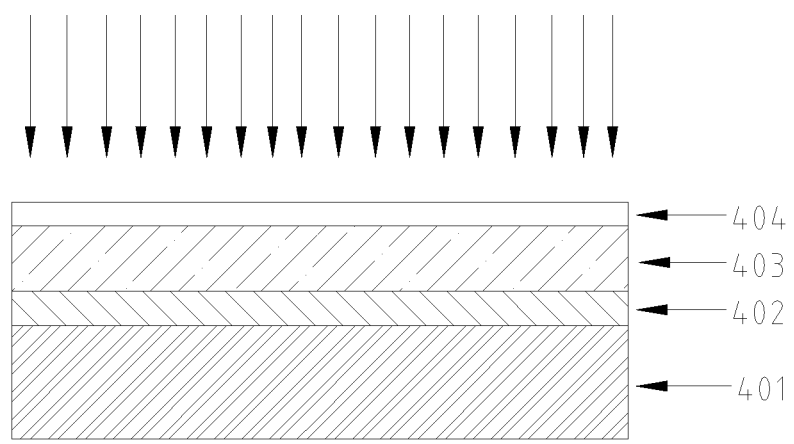
FIG. 4 is a schematic diagram illustrating a CdS buffer layer deposited onto a CIGS solar cell absorber layer by a chemical bath deposition process.

The present invention can be demonstrated with an example to deposit a CdS thin film on the surface of a CIGS absorber layer, as shown in FIG. 4. This figure is a schemat diagram illustrating the deposition of a CdS buffer 404 onto a CIGS absorber layer 403 that is coated on a piece of stainless steel substrate 401 issolated with a Mo layer 402. As an example, a 1000 meter long and 1 meter wide stainless steel roll coated with CIGS absorber layer may be used and delivered at a speed of 1 meter per minute. The CBD reaction chamber between the separation boards 117 and 116 is designed to be 12 meters long to meet a 12 minutes of reaction time. If the CIGS surface is assumed to be covered with a 3 mm thick solution during the deposition, 3 liters of solution shall be consumed in one minute and totally 3 $m^3$ of solution has to be used for the whole roll. To increase the efficiency of the spray, one may want to increase the solution consumption to 6 liters per minute. 10 spray nozzles 105 can be arranged fron the top to the bottom. In this way, every spray nozzle covers the area of 10×10 $cm^2$ with 10 ml of solution spraying out every second. However, a solution consumption of 6 liters per minure may not be necessary. One can control the top spray nozzles with more solution volume and gradually reduce the sprayed amount from the top to the bottom because the solution flows down from the top to the bottom. Sizes and distribution of the sprayed solution droplets can be well controlled by controlling the air pressure within the nozzles for the freshly mixed solution and the pump pressures for the aged one. To be careful, one can select a spray rate of 4 liters per minute. The total volume of the reaction solution used to complete the entire roll should be about 4 $m^3$. Two starting mother liquids should be prepared in two mixing tanks and then stored in two storage tanks with heating capabilities. One starting mother liquid is cadmium cation in concentrated ammonium hydroxide. The other starting mother liquid is a concentrated thiourea solution. A small tank such as 500 liters should be enough to mix and store the thiourea solution, but a tank volume larger than 1 $m^3$ is necessary to mix and store the cadmium ammonium solution. In addition, a large DI water container with a volume of 3 $m^3$ or more is required for the solution mixing. Two starting mother liquids and DI water are preheated and delivered at a quantitative ratio and a total volume more than 4 liters per minute to be mixed inside the vessel 104 and sprayed onto the travelling substrate. Turn on all of the wind knives at a constant air temperature between 70 and 80° C. Meanwhile, the heating elements 119 underneath the solution groove 108 are adjusted to a temperature higher than 80° C. to remain a constant solution temperature between 70 and 80° C. as required. Turn on all the spray pumps 106 to remain the reaction under control. The pumps and the heating elements are all automatically controlled through an operation software.

At the end of the reation chamber, the substrate is washed with the preheated DI water that has been used to rinse the substrate surface in next stage. In order to remove the reaction residues from the CdS surface as more as possible, one may use 6 liter of DI water per minute. As a result, 10 liters of the waste solution per minute are poured into the waste outlet 109. For the whole roll (1000 m×1 m), 10 m$^3$ of the waste sulution will be generated. It suggests that a waste treatment capability of 0.7 m$^3$ per hour may be necessary. By optimizing the washing process, one could reduce consumption of the washing solution to 4 liters per minute to minimize the waste treatment capability down to 0.5 m$^3$ per hour. The substrate surface can then be further washed, dried and winded to be a product roll. After completion of the production, one can use some diluted hydrochloric acid to clean the pumps and the spray pipes including the nozzles.

As the art described and exampled above, the present invention can be used to fabricate many different deposition materials if their preparations follow a CBD process. In particular, this apparatus are very useful to deposit CdS, ZnS, In$_2$S$_3$ or CdZnS window layers in manufacture of Group IB-IIIA-VIA and Group IIB-VIA solar cells onto the continuous flexible substrates with different widths. The equipment is easy to make, the process is easy to control, and the waste solutions are less.

What is claimed is:

1. An apparatus, CBD reactor, for forming thin films on flexible substrate surfaces by chemical bath deposition (CBD) in a roll-to-roll process, comprising:
   a roll unwinding unit;
   a roll winding unit;
   one or more modular segment(s) installed between said unwinding and said winding units to form a closed chamber of this reactor;
   wherein said modular segment includes a front wall, a back wall, a top roof and a bottom floor, and the modular segments on ends include a sidewall on one end and another sidewall on the other end;
   wherein said modular segments on ends possess a vertically cut slit on each sidewall to allow the flexible workpiece vertically going through;
   wherein said modular segment includes one or more rollers close and parallel to its back wall to vertically deliver said flexible workpiece;
   wherein said closed reactor chamber is separated into three sections with two boards: pre-cleaning section on one end close to the unwinding unit, rinsing section on the other end close to the winding unit, and reaction chamber including one or more modular segment(s) in the middle as a main section;
   wherein one or more spray combination(s) including a chemical resistant pump one or more solution pipe(s) and one or more spray nozzle(s) are installed inside said reaction chamber to spray gradually aged reaction solution to cover said workpiece front surface;
   wherein the solution sprayed onto said workpiece surface flows downward to the floor into a groove where accumulated aged solution flows synchronously along the same direction as the workpiece moves;
   wherein one or more board(s) crossover the entire chamber is (are) installed in front of the top edge of said workpiece to prevent the solution from spraying to its backside; and
   wherein one or more row(s) of wind knives crossover the entire chamber are installed in back of the bottom edge of said workpiece to maintain its backside drying.

2. The CBD reactor of claim 1, wherein the reactor is assembled with one or more modular segments and length of the whole apparatus is adjusted by adding or reducing numbers of the modular segments.

3. The CBD reactor of claim 1, wherein the continuous flexible workpiece coated with a solar cell absorber layer is loaded and a buffer layer material including CdS, In$_2$S$_3$ and ZnS is deposited from this CBD reactor to fabricate thin film solar cells, especially CIGS and/or CdTe cells.

4. The CBD reactor of claim 1, wherein the temperature inside said reaction chamber is controlled from 25° C. to 90° C., by
   preheated mother liquids to mix a fresh reaction solution;
   heating elements underneath said solution groove to heat the gradually aged reaction solution; and
   preheated compressed air through wind knives on the back bottom of said workpiece to heat the substrate workpiece.

5. The CBD reactor of claim 1, wherein the reaction ambience inside the reactor is sealed with two or more columns of wind knives to blow the preheated air into the chamber through said vertically cut narrow workpiece inlet and outlet slits.

6. The CBD reactor of claim 1, wherein a fresh reaction solution is continuously mixed in seconds with several preheated mother liquids, comprising:
   a mixing device including one or more solution inlet(s) and one solution outlet; and
   one or more solution pipe(s), one or more spray nozzles and one or more compressed air tube(s) to spray freshly mixed solution onto said workpiece surface.

7. The CBD reactor of claim 1, wherein said chamber is designed to allow said workpiece vertically moving into said pre-cleaning section and out of said rinsing section.

8. The CBD reactor of claim 1, wherein materials used to fabricate said reactor chamber must be chemical resistant and heat resistant to 90° C., including polymers, plastics and ceramics.

9. The CBD reactor of claim 1, wherein said flexible substrate workpiece includes metallic foils of stainless steel, aluminum, molybdenum, copper, nickel, and non-metallic films of polymers, plastics and flexible ceramics.

10. The CBD reactor of claim 1, wherein the height of the reactor ranges from 0.3 to 2.5 meters and the width ranges from 0.3 to 1.5 meters.

11. The CBD reactor of claim 9, wherein the width of said flexible substrates ranges from 0.1 to 2 meters, and the thickness of said substrates ranges from 0.03 to 0.5 millimeters.

\* \* \* \* \*